United States Patent [19]
Fujiwara

[11] Patent Number: 5,952,721
[45] Date of Patent: *Sep. 14, 1999

[54] SEMICONDUCTOR DEVICE HAVING OXYGEN-DOPED SILICON LAYER SO AS TO RESTRICT DIFFUSION FROM HEAVILY DOPED SILICON LAYER

[75] Inventor: Shuji Fujiwara, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/812,247

[22] Filed: Mar. 6, 1997

[30] Foreign Application Priority Data

Mar. 6, 1996 [JP] Japan .................................. 8-48538

[51] Int. Cl.$^6$ .......................... H01L 29/43; H01L 23/48; H01L 29/167
[52] U.S. Cl. .......................... 257/751; 257/740; 257/767; 257/611
[58] Field of Search .................................... 257/740, 751, 257/767, 385, 411, 306, 611; 438/653, 657, 684

[56] References Cited

U.S. PATENT DOCUMENTS

| | | | |
|---|---|---|---|
| 4,062,034 | 12/1977 | Matsushita et al. | 357/16 |
| 4,755,865 | 7/1988 | Wilson et al. | 357/63 |
| 4,897,368 | 1/1990 | Kobushi et al. | 438/592 |
| 4,914,046 | 4/1990 | Tobin et al. | 437/24 |
| 5,321,306 | 6/1994 | Choi et al. | 257/754 |
| 5,343,062 | 8/1994 | Tomioka | 257/297 |
| 5,486,704 | 1/1996 | Morishita | 257/9 |
| 5,650,344 | 7/1997 | Ito et al. | 438/287 |

FOREIGN PATENT DOCUMENTS

| | | |
|---|---|---|
| 0 415 775 | 3/1991 | European Pat. Off. . |
| 0 462 576 | 12/1991 | European Pat. Off. . |
| 50-110582 | 8/1975 | Japan . |
| 4-142079 | 5/1992 | Japan . |
| 4-326766 | 11/1992 | Japan . |
| 7-66409 | 3/1995 | Japan . |
| 7-297400 | 11/1995 | Japan . |

OTHER PUBLICATIONS

Yoshida Masakatsu et al., "Manufacture of Semiconductor Device", *Patent Abstracts of Japan*, Pub. No. 59016346, Pub. Date Jan. 27, 1984, Application Date Jul. 19, 1982, Application No. 57126418.

Daspet et al., "Structural and Technological Properties of Heavily In Situ Phosphorus–Doped low Pressure Chemically Vapour Deposited Silicon Films", Thin Solid Films, 175, pp. 43–38, 1989.

*Primary Examiner*—John Guay
*Attorney, Agent, or Firm*—Foley & Lardner

[57] ABSTRACT

A phosphorous doped amorphous silicon storage node electrode is treated with heat so as to be converted into a phosphorous doped polysilicon storage electrode, and the heat causes the phosphorous to be diffused into a shallow n-type source region of an n-channel enhancement type switching transistor; to protect the shallow n-type source region from the phosphorous, a phosphorous/oxygen doped amorphous silicon layer is formed between the shallow n-type source region and the phosphorous-doped amorphous silicon storage node electrode, and the oxygen decelerates the phosphorous diffused therethrough, thereby decreasing the amount of phosphorous diffused into the n-type shallow source region.

6 Claims, 5 Drawing Sheets

SEMICONDUCTOR DEVICE HAVING OXYGEN-DOPED SILICON LAYER SO AS TO RESTRICT DIFFUSION FROM HEAVILY DOPED SILICON LAYER

FIELD OF THE INVENTION

This invention relates to a semiconductor device and, more particularly, to the structure of a semiconductor device and a process of fabrication thereof.

DESCRIPTION OF THE RELATED ART

Polysilicon is an important material of the semiconductor device. Various kinds of electric circuit components are integrated on a semiconductor substrate together, and a gate electrode of a field effect transistor, a conductive wiring and an accumulating electrode of a storage capacitor are, by way of example, formed of the polysilicon. The field effect transistor and the storage capacitor form in combination a dynamic random access memory cell, and FIGS. 1A to 1C illustrate a typical example of the process of fabricating a dynamic random access memory cell. In the following description, phosphorous-doped silicon is deposited by using a chemical vapor deposition, and the chemical vapor deposition is disclosed by D. Bielle-Daspet et. al. in "STRUCTURE AND TECHNOLOGICAL PROPERTIES OF HEAVILY IN SITU PHOSPHOROUS-DOPED LOW PRESSURE CHEMICAL VAPOR DEPOSITED SILICON FILMS", Thin Solid Films, 175 (1989), pages 43 to 48.

The prior art process starts with preparation of a p-type silicon substrate 1. A thick field oxide layer 2 is selectively grown on the major surface of the silicon substrate 1. The thick field oxide layer 2 defines a plurality of active areas, and two of the active areas are shown on both sides of the thick field oxide layer 2. The two active areas are assigned to dynamic random access memory cells.

The surfaces of the active areas are thermally oxidized so as to form thin gate oxide layers 3a, and polysilicon is deposited over the entire surface of the structure, i.e., on the thick field oxide layer 2 and the thin gate oxide layers 3a. A photo-resist etching mask (not shown) is formed on the polysilicon layer, and the polysilicon layer is patterned into word lines WL. The word lines WL extend over the thick field oxide layer 2 and the thin gate oxide layers 3a, and the word lines WL on the thin gate oxide layers 3a serve as gate electrodes 3b.

N-type dopant impurity is ion implanted into the active areas and the word lines WL, and source regions 3c and drain regions 3d are formed in the active areas in a self-aligned manner with the gate electrodes 3b. The thin gate oxide layer 3a, the gate electrode 3b, the n-type source region 3c and the n-type drain region 3d as a whole constitute an n-channel enhancement type field effect transistor 3.

Subsequently, silicon oxide or the like is deposited over the entire surface of the resultant structure by using a chemical vapor deposition, and the silicon oxide forms a lower inter-level insulating layer 4a. A photo-resist etching mask (not shown) is formed on the lower inter-level insulating layer 4a, and the lower inter-level insulating layer 4a is selectively etched away so as to form contact holes open to the n-type drain regions 3d.

Conductive material is deposited over the entire surface of the lower inter-level insulating layer 4a. The conductive material fills the contact holes, and swells into a conductive material layer on the lower inter-level insulating layer 4a. A photo-resist etching mask (not shown) is formed on the conductive material layer, and the conductive material layer is selectively etched away so as to form bit lines BL on the lower inter-level insulating layer 4a. One of the bit lines BL is electrically connected to the n-type drain regions 3d of the n-channel enhancement type field effect transistors 3.

Subsequently, insulating material is deposited over the entire surface of the resultant structure, and forms an upper inter-level insulating layer 4b. A photo-resist etching mask (not shown) is formed on the upper inter-level insulating layer 4b, and the upper inter-level insulating layer 4b and the lower inter-level insulating layer 4a are selectively etched away so as to form contact holes 4c open to the n-type source regions 3c as shown in FIG. 1A.

Subsequently, phosphorous-doped amorphous silicon is deposited over the entire surface of the resultant structure by using a low-pressure chemical vapor deposition. The phosphorous-doped amorphous silicon is produced from gaseous mixture containing $PH_3$, $SiH_4$ and $N_2$. The phosphorous-doped amorphous silicon fills the contact holes 4c, and swells into a phosphorous-doped amorphous silicon layer 5a as shown in FIG. 1B.

A photo-resist etching mask (not shown) is formed on the phosphorus-doped amorphous silicon layer 5a, and the phosphorous-doped amorphous silicon layer is selectively etched away so as to form storage node electrodes 6a on the upper inter-level insulating layer 4b. The storage node electrodes 6a are treated with heat, and the phosphorous-doped amorphous silicon is converted to phosphorous-doped polysilicon.

The phosphorous-doped polysilicon storage node electrodes 6a are covered with a dielectric film 6b, and a cell plate electrode 6c is patterned from a conductive layer. The cell plate electrode 6c is opposed through the dielectric layer 6b to the storage node electrodes 6a as shown in FIG. 1C, and the storage node electrode 6a, the dielectric layer 6b and the cell plate electrode 6c as a whole constitute a storage capacitor 6. The storage node electrodes 6a are electrically connectable through the n-channel enhancement type field effect transistors 3 to the bit line BL.

The polysilicon is usually doped with the dopant impurity, because the dopant impurity decreases the resistance of the polysilicon layer. The heavier the dopant impurity, the lower the resistivity. For this reason, the phosphorous is doped into the amorphous silicon layer 5a and, accordingly, the storage node electrodes 6a. On the other hand, shallow source/drain regions are necessary for a miniature field effect transistor, because the short-channel effect is minimized. While the amorphous silicon is being crystallized to the polysilicon under the application of heat, the phosphorous is diffused into the n-type source regions 3c, and undesirably changes the threshold of the n-channel enhancement type field effect transistor 3 and the p-n junction between the p-type silicon substrate 1 and the n-type source regions 3c.

If the phosphorous is heavily doped into the amorphous silicon, a large amount of phosphorous is diffused into the channel regions, and widely changes the threshold of the n-channel enhancement type field effect transistors 3. The phosphorous vertically diffused makes the n-type source regions 3c deep.

The doped polysilicon gate electrodes 3b encounters a similar problem. If the polysilicon gate electrodes 3b are heavily doped with the dopant impurity, a large amount of dopant impurity is diffused through the thin gate oxide layer 3a into the channel region, and widely changes the threshold of the n-channel enhancement type field effect transistor 3.

For this reason, the manufacturer can not heavily dope the amorphous/polycrystal silicon with dopant impurity.

Even though the amorphous/polycrystal silicon is not heavily doped with the dopant impurity, the dopant impurity is still diffused from the amorphous/polycrystal silicon. If the manufacturer lightly dopes the amorphous/polycrystal silicon with a dopant impurity, the dopant impurity is diffused from the lightly doped amorphous/polycrystal silicon across a boundary, and the dopant impurity in the boundary portion is reduced.

In this situation, when the prior art dynamic random access memory cell is installed into an electronic system as a data storage element the lower portions of the storage node electrodes 6a tend to be depleted, and the dynamic random access memory cell can not stably store a data bit.

SUMMARY OF THE INVENTION

It is therefore an important object of the present invention to provide a semiconductor device which has a low resistive piece of heavily doped silicon without deterioration of device characteristics.

It is also an important object of the present invention to provide a process through which the semiconductor device is fabricated.

To accomplish the object, the present invention proposes to decelerate dopant impurity diffused in a boundary portion of a heavily doped polysilicon piece under application of heat.

In accordance with the present invention, there is provided a semiconductor device comprising at least one multi-layer structure formed over a semiconductor layer and having a heavily doped silicon layer and a diffusion decelerating layer provided between the heavily doped silicon layer and the semiconductor layer and having a diffusion coefficient smaller than that of the heavily doped silicon layer so as to prevent the semiconductor layer from a dopant impurity diffused from the heavily doped silicon layer.

In accordance with another aspect of the present invention, there is provided a process of fabricating a semiconductor device, comprising the steps of: a) preparing a semiconductor layer; b) depositing a diffusion decelerating layer over the semiconductor layer through a chemical vapor deposition using a first gaseous mixture containing a source gas of silicon and a first gas selected from the group consisting of $O_2$, $N_2O$, NO, CO, $CO_2$ or $NH_3$, a first dopant impurity being introduced into the silicon so as to decrease a diffusion coefficient of the silicon; c) depositing a heavily doped silicon layer on the diffusion decelerating layer through a chemical vapor deposition using a second gaseous mixture containing the source gas; and d) applying heat to the lamination of the diffusion decelerating layer and the heavily doped silicon layer.

BRIEF DESCRIPTION OF THE DRAWINGS

The features and advantages of the semiconductor device and the process according to the present invention will be more clearly understood from the following description taken in conjunction with the accompanying drawings in which.

DESCRIPTION OF THE PREFERRED EMBODIMENTS

First Embodiment

Figure 1A:
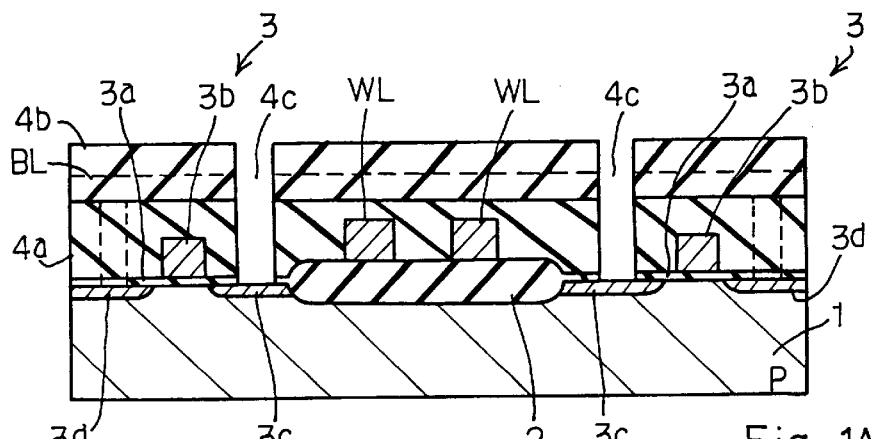
FIGS. 1A to 1C are cross sectional views showing the prior art process sequence for fabricating a dynamic random access memory cell.
Figure 1B:
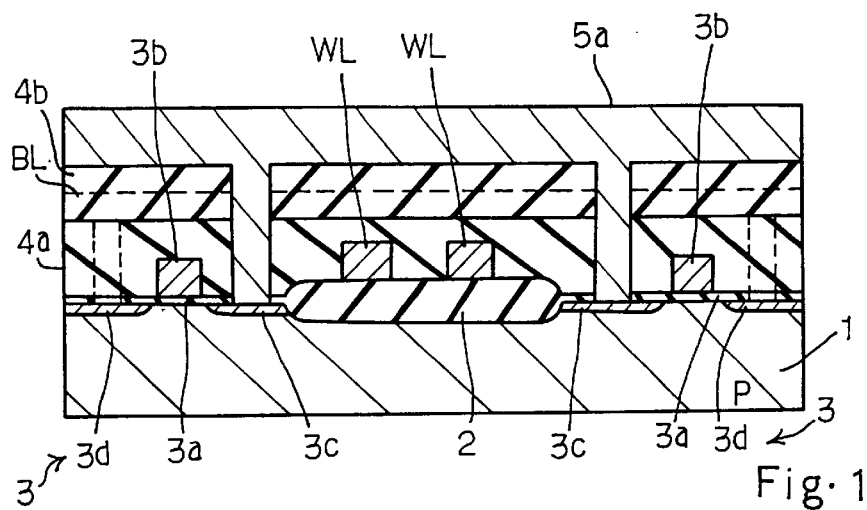
Figure 1C:
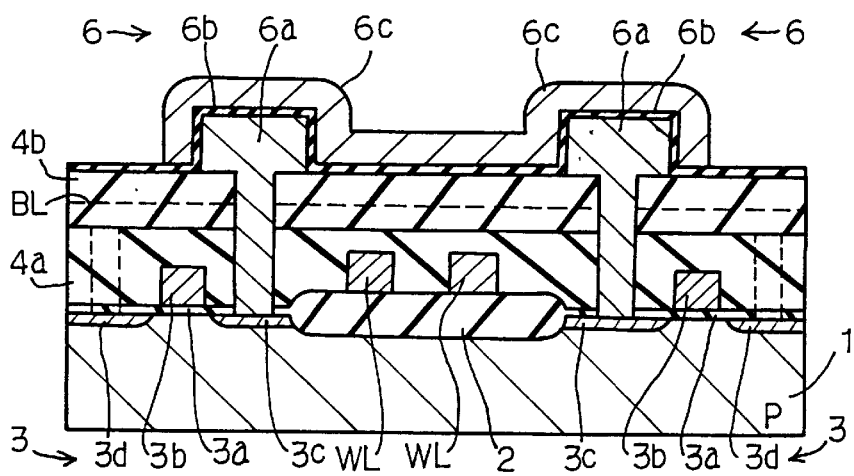

FIGS. 2A to 2D illustrate a process of fabricating a dynamic random access memory cell embodying the present invention. The process starts with preparation of a p-type silicon substrate 11. A thick field oxide layer 12 is selectively grown on the major surface of the silicon substrate 11. The thick field oxide layer 12 defines a plurality of active areas, and two of the active areas are shown in the figures on both sides of the thick field oxide layer 12. The two active areas are assigned to dynamic random access memory cells.

The surfaces of the active areas are thermally oxidized so as to form thin gate oxide layers 13a, and polysilicon is deposited over the entire surface of the structure, i.e., on the thick filed oxide layer 12 and the thin gate oxide layers 13a.

Photo-resist solution is spread over the polysilicon layer, and is baked so as to form a photo-resist layer. A pattern image for word lines is optically transferred from a photo-mask (not shown) to the photo-resist layer, and a latent image is formed in the photo-resist layer. The latent image is developed by applying developing solution to the photo-resist layer, and the photo-resist layer is patterned into a photo-resist etching mask (not shown). In this way, the photo-resist etching mask is formed on the polysilicon layer, and the polysilicon layer is patterned into word lines WL. The word lines WL extend over the thick field oxide layer 12 and the thin gate oxide layers 13a, and the word lines WL on the thin gate oxide layers 13a serve as gate electrodes 13b.

Phosphorous is ion implanted into the active areas and the word lines WL, and source regions 13c and drain regions 13d are formed in the active areas in a self-aligned manner with the gate electrodes 13b. The thin gate oxide layer 13a, the gate electrode 13b, the n-type source region 13c and the n-type drain region 13d as a whole constitute an n-channel enhancement type field effect transistor 13.

Subsequently, silicon oxide or the like is deposited over the entire surface of the resultant structure by using a chemical vapor deposition, and the silicon oxide forms a lower inter-level insulating layer 14a. A photo-resist etching mask (not shown) is formed on the lower inter-level insulating layer 14a, and the lower inter-level insulating layer 14a and the thin gate oxide layers 13a are selectively etched away so as to form contact holes open to the n-type drain regions 13d.

Refractory metal silicide is deposited over the entire surface of the lower inter-level insulating layer 14a by using a sputtering technique. The refractory metal silicide fills the contact holes, and swells into a refractory metal silicide layer on the lower inter-level insulating layer 14a. A photo-resist etching mask (not shown) is formed on the refractory metal silicide layer, and the refractory metal silicide layer is selectively etched away so as to form bit lines BL on the lower inter-level insulating layer 14a. One of the bit lines BL is electrically connected to the n-type drain regions 13d of the n-channel enhancement type field effect transistors 13.

Figure 2A:
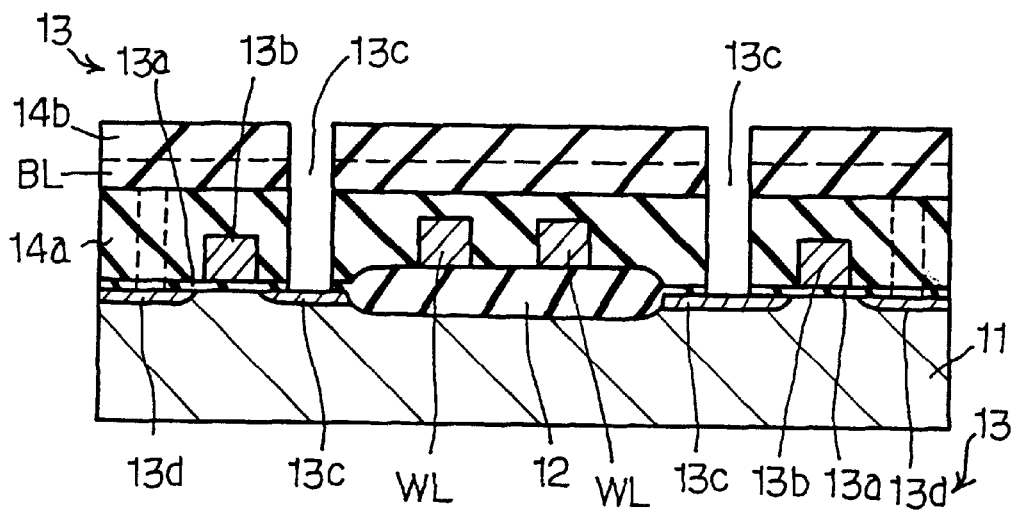
FIGS. 2A to 2D are cross sectional views showing a process sequence for fabricating a dynamic random access memory cell according to the present invention.

Subsequently, insulating material is deposited over the entire surface of the resultant structure by using a chemical vapor deposition, and forms an upper inter-level insulating layer 14b. A photo-resist etching mask (not shown) is formed on the upper inter-level insulating layer 14b, and the upper inter-level insulating layer 14b, the lower inter-level insulating layer 14a and the thin gate oxide layers 13a are selectively etched away so as to form contact holes 14c open to the n-type source regions 13c as shown in FIG. 2A.

Figure 2B:
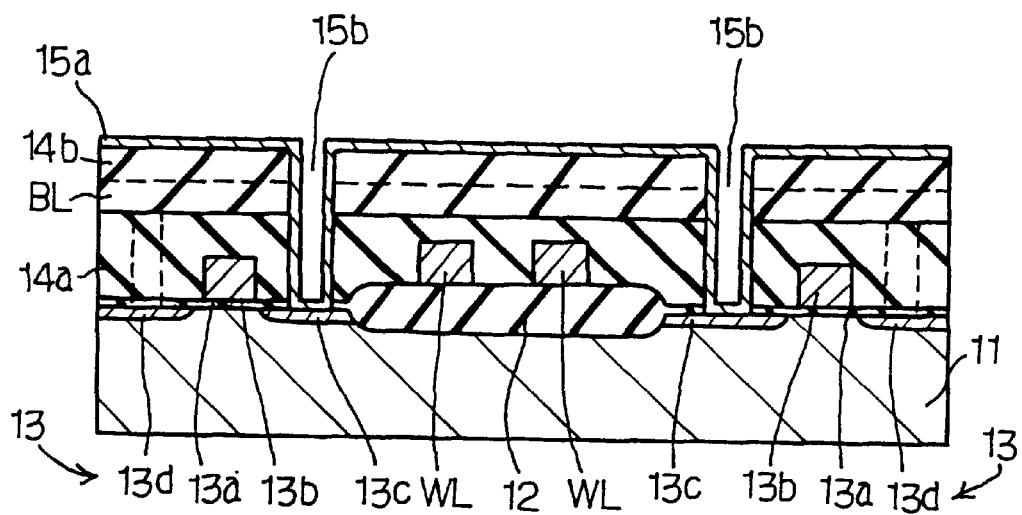

Subsequently, phosphorous/oxygen-doped amorphous silicon is deposited to 50 nanometers thick over the entire surface of the resultant structure by using a low-pressure chemical vapor deposition. The phosphorous/oxygen-doped amorphous silicon is produced from gaseous mixture containing $PH_3$, $SiH_4$, $N_2$ and $N_2O$, and forms a phosphorous/oxygen doped amorphous silicon layer 15a. The phosphorous/oxygen-doped amorphous silicon contains phosphorous at $5 \times 10^{20}$ cm$^{-3}$, and the oxygen is 1 mol %. The phosphorous/oxygen doped amorphous silicon layer 15a topographically extends over the entire surface of the structure, and exposed surfaces of the upper and lower inter-level insulating layers 14a/14b are covered with the phosphorous/oxygen doped amorphous silicon layer 15a as shown in FIG. 2B. The phosphorous/oxygen doped amorphous silicon layer 15a defines a secondary contact holes 15b in the contact holes 13c. The in situ phosphorous doping is desirable, because the oxygen does not allow amorphous silicon to be doped with much phosphorous in a post deposition doping.

Figure 2C:
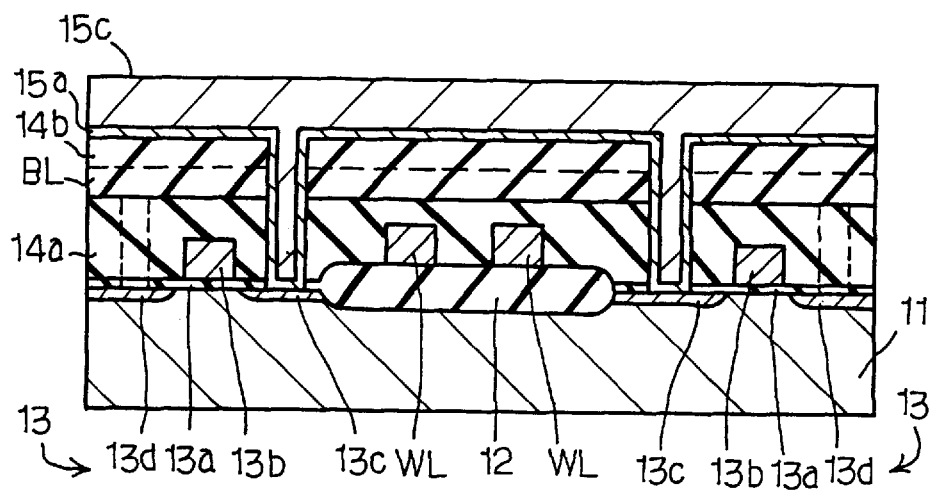

When the phosphorous/oxygen doped amorphous silicon layer 15a reaches 50 nanometers thick, $N_2O$ gas is interrupted, the low pressure chemical vapor deposition is continued with the gaseous mixture containing $PH_3$, $SiH_4$ and $N_2$. Phosphorous-doped amorphous silicon is deposited over the phosphorous/oxygen doped amorphous silicon layer 15a, and contains phosphorous at $5 \times 10^{20}$ cm$^{-3}$. The phosphorous-doped amorphous silicon fills the secondary contact holes 15b, and swells into a phosphorous-doped amorphous silicon layer 15c as shown in FIG. 2C. The diffusion coefficient of the phosphorous-doped amorphous silicon is larger than that of the phosphorous/oxygen doped amorphous silicon layer.

A photo-resist etching mask (not shown) is formed on the phosphorus-doped amorphous silicon layer 15c, and the phosphorous-doped amorphous silicon layer 15c is selectively etched away by using a dry etching technique so as to form storage node electrodes 16a on the upper inter-level insulating layer 14b.

The storage node electrodes 16a are treated with heat, and the phosphorous-doped amorphous silicon is converted to phosphorous-doped polysilicon. As described hereinbefore, the phosphorous-doped amorphous silicon layer 15c contains the phosphorous in great amount than the phosphorous-doped amorphous silicon layer 5a, and the phosphorous are diffused from the phosphorous-doped amorphous silicon layer 15c toward the n-type source regions 13c during the heat treatment. However, the phosphorous/oxygen doped amorphous silicon decelerates the phosphorous diffused into the n-type source regions 13c, and only a small amount of phosphorous is diffused into the n-type source regions 13c. As a result, the n-type source regions 13c maintains the original impurity profile, and the channel doping level is not changed.

Figure 2D:
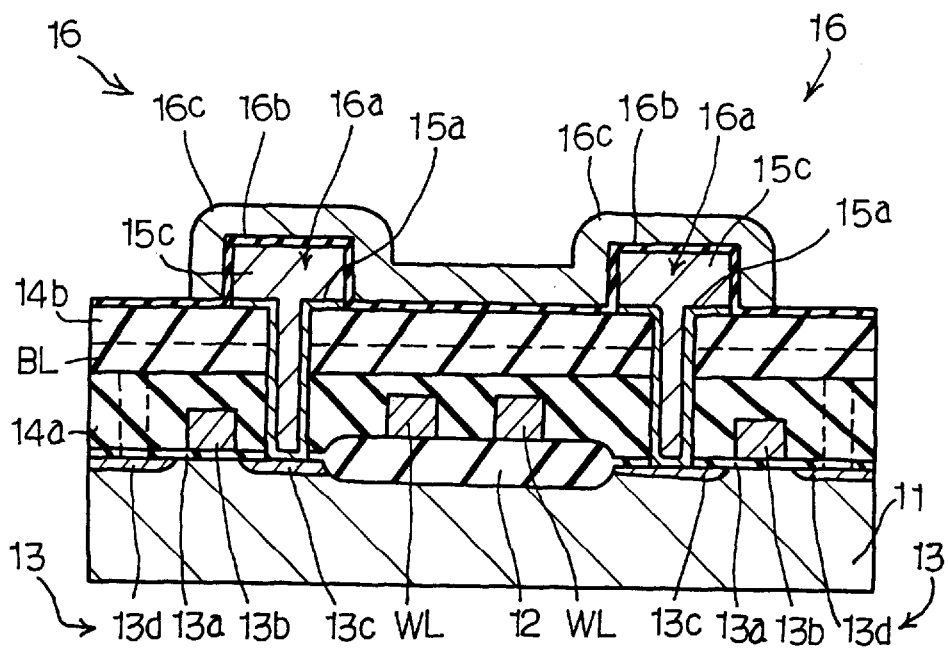

The phosphorous-doped polysilicon storage node electrodes 16a are covered with a dielectric film 16b, and a cell plate electrode 16c is patterned from a polysilicon layer. The cell plate electrode 16c is opposed through the dielectric layer 16b to the storage node electrodes 16a as shown in FIG. 2D, and the storage node electrode 16a, the dielectric layer 16b and the cell plate electrode 16c as a whole constitute a storage capacitor 16. The storage node electrodes 16a are electrically connectable through the n-channel enhancement type field effect transistors 13 to the bit line BL. The storage capacitor 16 and the n-channel enhancement type field effect transistor 13 as a whole constitute a dynamic random access memory cell.

The decelerating capability of the phosphorous/oxygen doped amorphous silicon layer 15a is dependent on the oxygen concentration and the thickness thereof. The present inventor determined the appropriate range for the oxygen. The appropriate range was 0.1 mol % to 10 mol %. When the oxygen was less than 0.1 mol %, a large mount of phosphorous was diffused through the phosphorous/oxygen doped amorphous silicon layer 15a into the n-type source regions 13c, and the phosphorous/ oxygen doped amorphous silicon layer 15a could not serve as a diffusion decelerator. On the other hand, when the oxygen was greater than 10 mol %, the oxygen increased the resistivity, and deteriorated the data storage capability of the storage capacitor 16.

The recommendable thickness was dependent on the oxygen concentration, and ranged between 10 nanometers to 150 nanometers thick. The recommendable thickness was reasoned as similar to the concentration range.

In this instance, the phosphorous/oxygen doped amorphous silicon layer 15a serves as a diffusion decelerating layer, and a first dopant impurity and a second dopant impurity are the phosphorous and the oxygen, respectively.

As will be appreciated from the foregoing description, the phosphorous/oxygen doped amorphous silicon layer 15a allows the manufacturer to increase the dopant concentration of the storage node electrodes 16a without a substantial diffusion into the silicon substrate, and the process according to the present invention allows a manufacturer to enhance the reproducibility and the reliability of the dynamic random access memory cell.

Second Embodiment

Figure 3A:
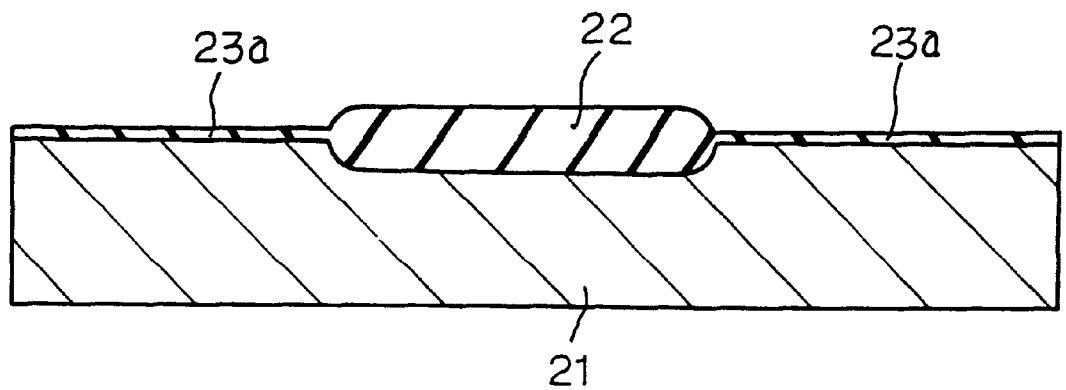
FIGS. 3A to 3D are cross sectional views showing a process sequence for fabricating a field effect transistor according to the present invention.

FIGS. 3A to 3D illustrate a process of fabricating a field effect transistor embodying the present invention. The process starts with preparation of a p-type silicon substrate 21. A thick field oxide layer 22 is selectively grown on the major surface of the p-type silicon substrate 21, and defines a plurality of active areas in the major surface. Two active areas are shown on both sides of the thick field oxide layer 22, and are assigned to two field effect transistors, respectively. Channel doping is carried out, and thin gate oxide layers 23 are thermally grown to 15 nanometers thick on the active areas as shown in FIG. 3A.

Figure 3B:
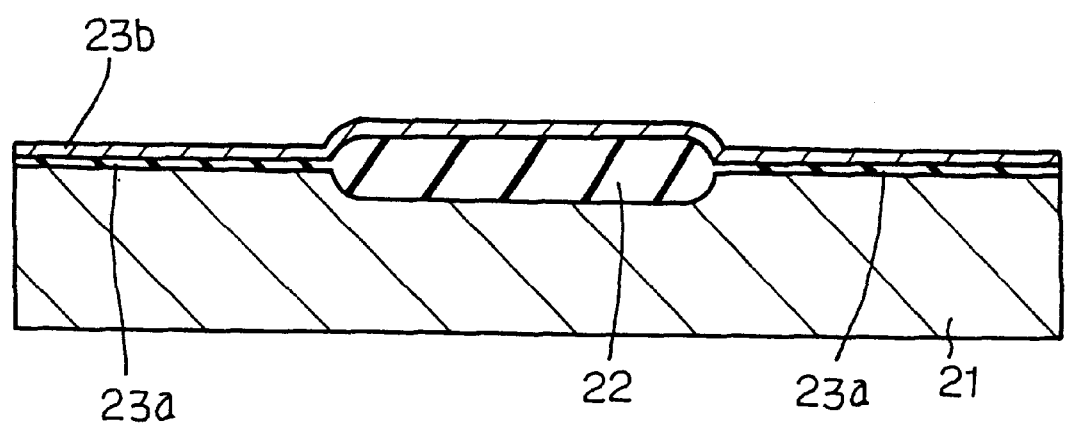

Subsequently, the p-type silicon substrate 21 is placed in a reaction chamber of a low pressure chemical vapor deposition system (not shown), and gaseous mixture containing $PH_3$, $SiH_4$, $N_2$ and $N_2O$ is supplied to the reaction chamber. The phosphorous/oxygen doped polysilicon is deposited to 30 nanometers thick over the entire surface of the resultant structure, i.e., the thin gate oxide layers 23a and the thick field oxide layer 22 as shown in FIG. 3B. The phosphorous is doped in the phosphorous/oxygen doped polysilicon layer 23b at $1 \times 10^{20}$ cm$^{-3}$, and the oxygen content is 3 mol %.

Figure 3C:
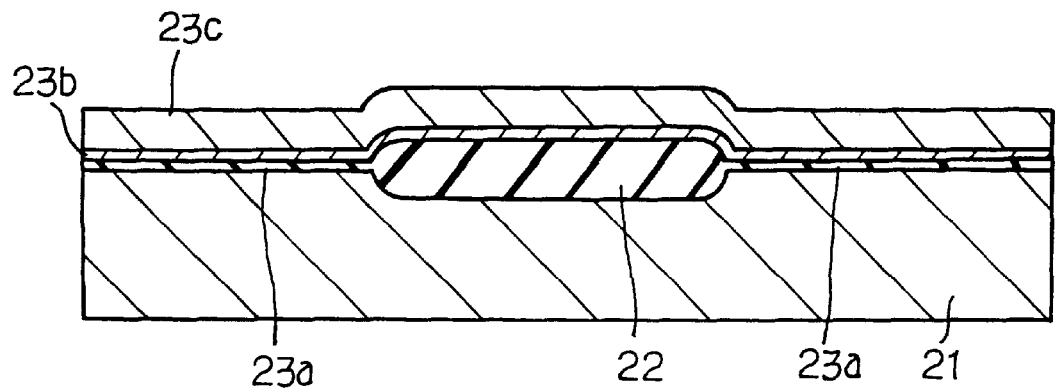
Figure 3D:
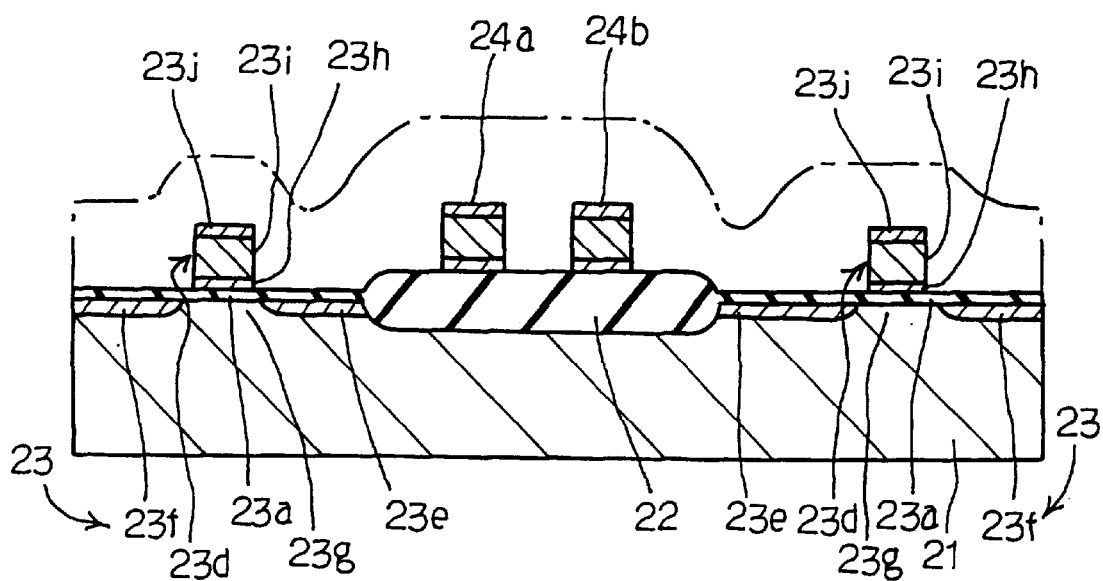

When the phosphorous/oxygen doped polysilicon layer 23b reaches 30 nanometers thick, $PH_3$ gas is eliminated from the gaseous mixture, and phosphorous doped polysilicon is deposited to 500 nanometers thick on the phosphorous/oxygen doped polysilicon layer 23b. Thus, the phosphorous doped polysilicon layer 23c is laminated on the phosphorous/oxygen doped polysilicon layer 23b as shown in FIG. 3C. The phosphorous doped polysilicon has a greater diffusion coefficient than the phosphorous/oxygen doped polysilicon.

Subsequently, tungsten silicide (WSi) is deposited over the entire surface of the phosphorous doped polysilicon layer 23c by using a sputtering technique, and a photo-resist etching mask (not shown) is provided on the tungsten silicide layer. The tungsten silicide layer, the phosphorous-doped polysilicon layer 23c and the phosphorous/oxygen doped polysilicon layer 23b are selectively etched away by using a dry etching, and gate electrodes 23d and other conductive wirings 24a and 24b are formed on the thin gate insulating layers 23a and the thick field oxide layer 22.

N-type dopant impurity is ion implanted into the active areas, and n-type source regions 23e and n-type drain regions 23f are formed in the active areas in a self-aligned manner with the gate electrodes 23d. A surface portion of the p-type silicon substrate 21 between the n-type source region 23e and the n-type drain region 23f serves as a channel region 23g. The ion-implanted dopant impurity is activated through a heat treatment, and the thin gate insulating layer 23a, the gate electrode 23d, the n-type source region 23e, the n-type drain region 23f and the channel region 23g as a whole constitute a field effect transistor 23. A phosphorous/oxygen doped polysilicon strip 23h, a phosphorous doped polysilicon strip 23i and a tungsten silicide strip 23j as a whole constitute the gate electrode 23d.

The phosphorous is diffused from the heavily phosphorous-doped polysilicon strip during the heat treatment. However, the phosphorous/oxygen doped polysilicon decelerates the phosphorous diffused therethrough, and does not allow the phosphorous to reach the channel regions. For this reason, the field effect transistor 23 keeps the threshold value as expected. Even if a heat treatment is carried out after the completion of the field effect transistor, the phosphorous/oxygen doped polysilicon also decelerates the phosphorous diffused from the heavily phosphorous doped polysilicon, and the characteristics of the field effect transistor 23 is never undesirably changed.

Although particular embodiments of the present invention have been shown and described, it will be obvious to those skilled in the art that various changes and modifications may be made without departing from the spirit and scope of the present invention.

In the above described embodiments, oxygen is introduced into the silicon layer. However, the present inventor confirmed that the oxygen was replaceable with nitrogen so as to decelerate the dopant impurity diffused therethrough. The nitrogen may be supplied from $NH_3$ mixed into the process gas. A recommendable nitrogen content and a recommendable nitrogen thickness were identical with those of the oxygen.

$N_2O$ gas may be replaced with $O_2$ gas, NO gas, CO gas or $CO_2$ gas.

The oxygen/nitrogen doped silicon layer may be single crystal.

The diffusion decelerator, i.e., oxygen/nitrogen doped silicon layer may be formed between a shallow impurity region and a heavily doped silicon wiring electrically connected to the shallow impurity region.

The oxygen/nitrogen doped silicon layer is effective against a diffusion due to a heat treatment carried out for another impurity layer or a conductive layer.

Finally, a heavily doped silicon layer may be directly or indirectly held in contact with an impurity region formed in a semiconductor layer provided over a semiconductor substrate.

What is claimed is:

1. A semiconductor device comprising:
   an impurity region serving as a source region of a field effect transistor;
   a heavily doped silicon layer doped with a first dopant impurity for imparting a certain conductivity type thereto; and
   a diffusion decelerating silicon layer provided between the heavily doped silicon layer and the semiconductor layer, said diffusion decelerating layer being doped in situ with the first dopant impurity and a second dopant impurity for decreasing the diffusion coefficient of the first dopant impurity,
   wherein said semiconductor layer is an impurity region, and said diffusion decelerating layer is held in contact with said impurity region, and
   wherein said impurity region is a source region of a field effect transistor, and said heavily doped silicon layer and said diffusion decelerating layer form in combination a storage node electrode of a capacitor.

2. A semiconductor device comprising:
   a semiconductor layer of a first conductivity type;
   a heavily doped silicon layer doped with a first dopant impurity for imparting the first conductivity type thereto; and
   a diffusion decelerating silicon layer between the heavily doped silicon layer and the semiconductor layer providing a current path there between, the diffusion deceleration layer being doped in situ with the first dopant impurity and a second dopant impurity for decreasing the diffusion coefficient of the first dopant impurity, the diffusion decelerating layer having a concentration of the first dopant impurity that is as great as the concentration as the first dopant impurity in the heavily doped silicon layer.

3. The semiconductor device as set forth in claim 2, in which said second dopant impurity is selected from the group consisting of oxygen and nitrogen.

4. The semiconductor device as set forth in claim 3, in which said second dopant impurity ranges from 0.1 to 10 mol %.

5. The semiconductor device as set forth in claim 2, in which said semiconductor layer is an impurity region, and said diffusion decelerating layer is held in contact with said impurity region.

6. The semiconductor device as set forth in claim 5, wherein the impurity region is a source region of a field effect transistor, and the heavily doped silicon layer and the diffusion deceleration layer form in combination a storage node electrode of a capacitor.

* * * * *